US012631976B2

(12) United States Patent
Butler et al.

(10) Patent No.: US 12,631,976 B2
(45) Date of Patent: May 19, 2026

(54) METHOD OF REDUCING CYCLIC ERROR EFFECTS IN A LITHOGRAPHIC PROCESS, PROJECTION SYSTEM AND LITHOGRAPHIC APPARATUS COMPRISING A PROJECTION SYSTEM

(71) Applicant: ASML NETHERLANDS B.V., Veldhoven (NL)

(72) Inventors: Hans Butler, Best (NL); Robertus Johannes Marinus De Jongh, Boxmeer (NL)

(73) Assignee: ASML NETHERLANDS B.V., Veldhoven (NL)

( * ) Notice: Subject to any disclaimer, the term of this patent is extended or adjusted under 35 U.S.C. 154(b) by 163 days.

(21) Appl. No.: 18/717,684

(22) PCT Filed: Dec. 6, 2022

(86) PCT No.: PCT/EP2022/084549
§ 371 (c)(1),
(2) Date: Jun. 7, 2024

(87) PCT Pub. No.: WO2023/117399
PCT Pub. Date: Jun. 29, 2023

(65) Prior Publication Data
US 2025/0053102 A1 Feb. 13, 2025

(30) Foreign Application Priority Data
Dec. 23, 2021 (EP) ..................................... 21217454

(51) Int. Cl.
*G03F 7/20* (2006.01)
*G03F 7/00* (2006.01)

(52) U.S. Cl.
CPC ........ *G03F 7/7085* (2013.01); *G03F 7/70258* (2013.01); *G03F 7/70525* (2013.01); *G03F 7/70825* (2013.01)

(58) Field of Classification Search
CPC .............. G03F 7/7085; G03F 7/70258; G03F 7/70525; G03F 7/70825
See application file for complete search history.

(56) References Cited

U.S. PATENT DOCUMENTS

2006/0139586 A1  6/2006  Eussen
2012/0154780 A1*  6/2012  Demarest ................. G01D 5/38
                                                       355/72

(Continued)

FOREIGN PATENT DOCUMENTS

DE      102017200793      1/2018
EP           1469348      10/2004
WO       2021/094340      5/2021

OTHER PUBLICATIONS

International Search Report and Written Opinion issued in corresponding PCT Patent Application No. PCT/EP2022/084549, dated Mar. 17, 2023.

*Primary Examiner* — Mesfin T Asfaw
(74) *Attorney, Agent, or Firm* — Pillsbury Winthrop Shaw Pittman, LLP

(57) ABSTRACT

A method of reducing cyclic error effects in a lithographic process having a projection phase and an idle phase, the method including controlling in a first control loop a first position of a first module, the first module being a position controlled mirror of a projection system, the first control loop having a first bandwidth and including a first position measurement system having a first cyclic error, wherein controlling the first position includes continuously moving the first module at least during the projection phase, such (Continued)

that a first main frequency of the first cyclic error will be
above the first bandwidth of the first control loop.

20 Claims, 4 Drawing Sheets

(56)                 References Cited

U.S. PATENT DOCUMENTS

| | | |
|---|---|---|
| 2013/0278914 A1 | 10/2013 | Demarest |
| 2017/0363965 A1 | 12/2017 | Butler et al. |

* cited by examiner

METHOD OF REDUCING CYCLIC ERROR EFFECTS IN A LITHOGRAPHIC PROCESS, PROJECTION SYSTEM AND LITHOGRAPHIC APPARATUS COMPRISING A PROJECTION SYSTEM

CROSS-REFERENCE TO RELATED APPLICATION

The application is the U.S. national phase entry of PCT Patent Application No. PCT/EP2022/084549 which was filed on Dec. 6, 2022, which claims priority of European Patent Application No. 21217454.4 which was filed on Dec. 23, 2021 and which is incorporated herein in its entirety by reference.

FIELD

The present invention relates to a method of reducing cyclic error effects in a lithographic process. The invention further relates to a projection system and a lithographic apparatus comprising such projection system.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern at a patterning device (e.g., a mask) onto a layer of radiation-sensitive material (resist) provided on a substrate.

To project a pattern on a substrate a lithographic apparatus may use electromagnetic radiation. The wavelength of this radiation determines the minimum size of features which can be formed on the substrate. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

In known embodiments of a lithographic apparatus, a projection system with one or more mirrors may be provided. To accurately position the mirrors, for example to counteract vibrations, the mirror may be position controlled. Such a position controlled mirror may be actively controlled by a feedback controller on the basis of an actual position of the mirror measured by a position measurement system such as an interferometer or an encoder measurement system.

The principle of an interferometer is based on interference of two beams originating from the same source where one beam travels between transmitter, target, e.g. the mirror, back to a receiver and the other beam travels over a fixed distance. This interference pattern is by approximation a sinusoidal signal as function of the displacement of the target. There may be periodic deviations on this sinusoidal signal, these are higher orders which are also dependent on the distance of the target, so called cyclic errors.

Since the cyclic errors have a negative effect on the accuracy of position measurement, it is desirable that these cyclic errors are compensated. To realize this compensation the cyclic errors may be calibrated and compensated in software. But this is only possible when these cyclic errors are stable over time. However, for example due to thermal drift, the cyclic errors may change over time, and as a result the calibration is not accurate and the measurement accuracy may substantially decrease due to drift effects.

This may for example cause a position dependent offset in the measurement error when the mirror is not moved. This may hamper optical substrate table position measurements because any adjustment after these optical measurements will not move the mirror to the correct position. Also, a dynamic disturbance may occur when mirrors scan during exposures. This has a direct impact on the performance.

Other position measurement systems, such as encoder measurement systems may also have cyclic error that are instable over time.

SUMMARY

It is an object of the invention to provide a method of reducing cyclic error effects in a lithographic process. Further, it is an object of the invention to provide a projection system that is arranged to reduce cyclic error effects and a lithographic apparatus comprising such projection system.

According to an aspect the invention there is provided method of reducing cyclic error effects in a lithographic process having a projection phase and an idle phase, wherein the method comprises controlling in a first control loop a first position of a first module, the first module being a position controlled mirror of a projection system, the first control loop having a first bandwidth and comprising a first position measurement system having a first cyclic error, wherein controlling the first position comprises continuously moving the first module at least during the projection phase, such that a first main frequency of the first cyclic error will be above the first bandwidth of the first control loop.

According to an aspect the invention there is provided projection system to project a beam, comprising:
- a first module having a first movement range, the first module being a position controlled mirror of the projection system arranged to reflect the beam,
- a first position measurement system to measure a first position of the first module,
- a control system comprising a first control loop to control the first position of the first module, the first control loop having a first bandwidth, wherein the control system is arranged to continuously move the first module at least during a projection phase of a lithographic process, such that a first main frequency of a first cyclic error of the first position measurement system will be above the first bandwidth of the first control loop.

According to an aspect, there is provided alithographic apparatus comprising the projection system ad described herein.

BRIEF DESCRIPTION OF THE DRAWINGS

Embodiments of the invention will now be described, by way of example only, with reference to the accompanying schematic drawings, in which.

DETAILED DESCRIPTION

Figure 1:
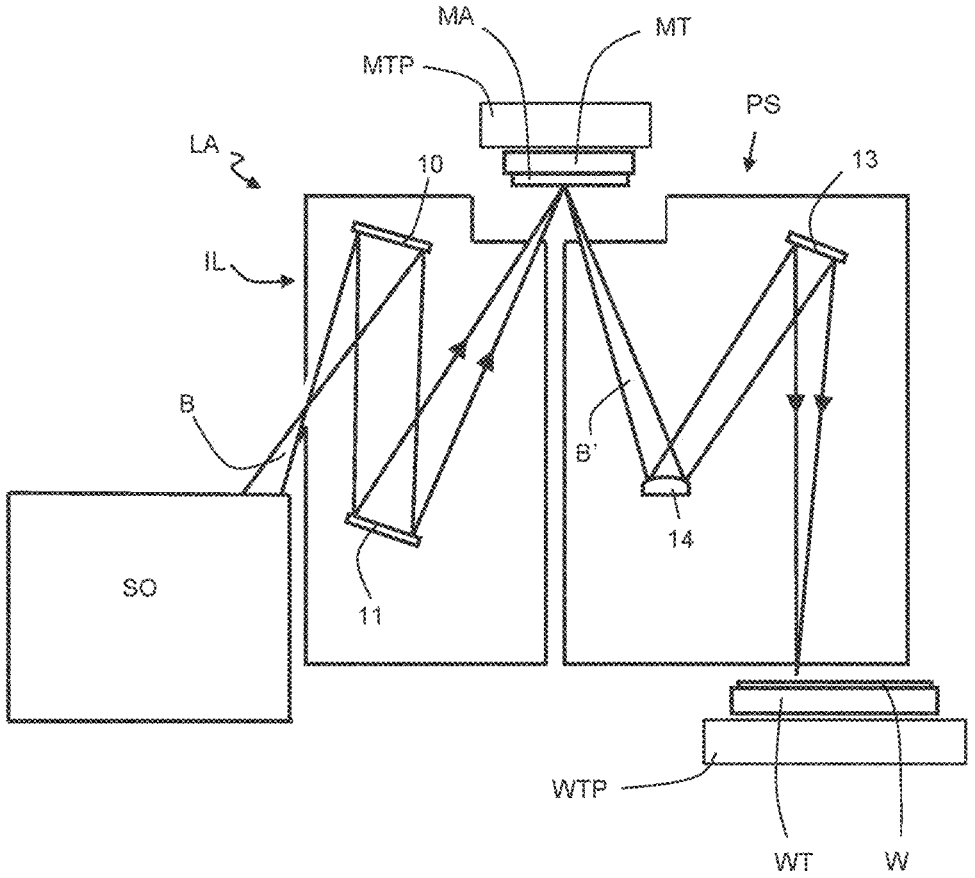
FIG. 1 depicts a lithographic system comprising a lithographic apparatus and a radiation source.

FIG. 1 shows a lithographic system comprising a radiation source SO and a lithographic apparatus LA. The radiation source SO is configured to generate an EUV radiation beam B and to supply the EUV radiation beam B to the lithographic apparatus LA. The lithographic apparatus LA comprises an illumination system IL, a support structure MT configured to support a patterning device MA (e.g., a mask), a projection system PS and a substrate table WT configured to support a substrate W.

A substrate table positioning system WTP is provided to position the substrate table WT in a desired position. The substrate positioning system WTP comprises a position measurement system to measure a position of the substrate table WT and an actuation system to move the substrate table WT to a desired position. A patterning device support positioning system MTP is provided to position the support structure MT in a desired position. The patterning device support positioning system MTP also comprises a position measurement system to measure a position of the support structure MT and an actuation system to move the support structure MT to a desired position.

The illumination system IL is configured to condition the EUV radiation beam B before the EUV radiation beam B is incident upon the patterning device MA. Thereto, the illumination system IL may include a facetted field mirror device 10 and a facetted pupil mirror device 11. The faceted field mirror device 10 and facetted pupil mirror device 11 together provide the EUV radiation beam B with a desired cross-sectional shape and a desired intensity distribution. The illumination system IL may include other mirrors or devices in addition to, or instead of, the faceted field mirror device 10 and faceted pupil mirror device 11.

After being thus conditioned, the EUV radiation beam B interacts with the patterning device MA. As a result of this interaction, a patterned EUV radiation beam B' is generated. The projection system PS is configured to project the patterned EUV radiation beam B' onto the substrate W. For that purpose, the projection system PS may comprise a plurality of mirrors 13, 14 which are configured to project the patterned EUV radiation beam B' onto the substrate W held by the substrate table WT. The projection system PS may apply a reduction factor to the patterned EUV radiation beam B', thus forming an image with features that are smaller than corresponding features on the patterning device MA. For example, a reduction factor of 4 or 8 may be applied. Although the projection system PS is illustrated as having only two mirrors 13, 14 in FIG. 1, the projection system PS may include a different number of mirrors (e.g. six or eight mirrors).

The substrate W may include previously formed patterns. Where this is the case, the lithographic apparatus LA aligns the image, formed by the patterned EUV radiation beam B', with a pattern previously formed on the substrate W.

A relative vacuum, i.e. a small amount of gas (e.g. hydrogen) at a pressure well below atmospheric pressure, may be provided in the radiation source SO, in the illumination system IL, and/or in the projection system PS.

The radiation source SO may be a laser produced plasma (LPP) source, a discharge produced plasma (DPP) source, a free electron laser (FEL) or any other radiation source that is capable of generating EUV radiation.

The lithographic process comprises a series of projection phases, in which the patterned EUV radiation beam B' is projected onto the substrate W (exposure phase) and/or in which the substrate W is being aligned with the patterned EUV radiation beam B' (alignment phase) and idle phases in which no patterned EUV radiation beam B' is projected onto the substrate W, or on a non-relevant part of the substrate W and positioning accuracy of the substrate W with respect to the patterned EUV radiation beam B' is less critical. During the projection phase the patterning device and the substrate may be moved in a scanning movement with a constant scanning velocity. The idle phase may be used to decelerate and (re) accelerate the patterning device MT and the substrate W to the desired scanning velocity and a desired alignment with respect to the EUV radiation beam B and the patterned EUV radiation beam B', respectively. The constant scanning velocity of the patterning device MT is typically different than the constant scanning velocity of the substrate W.

Figure 2:
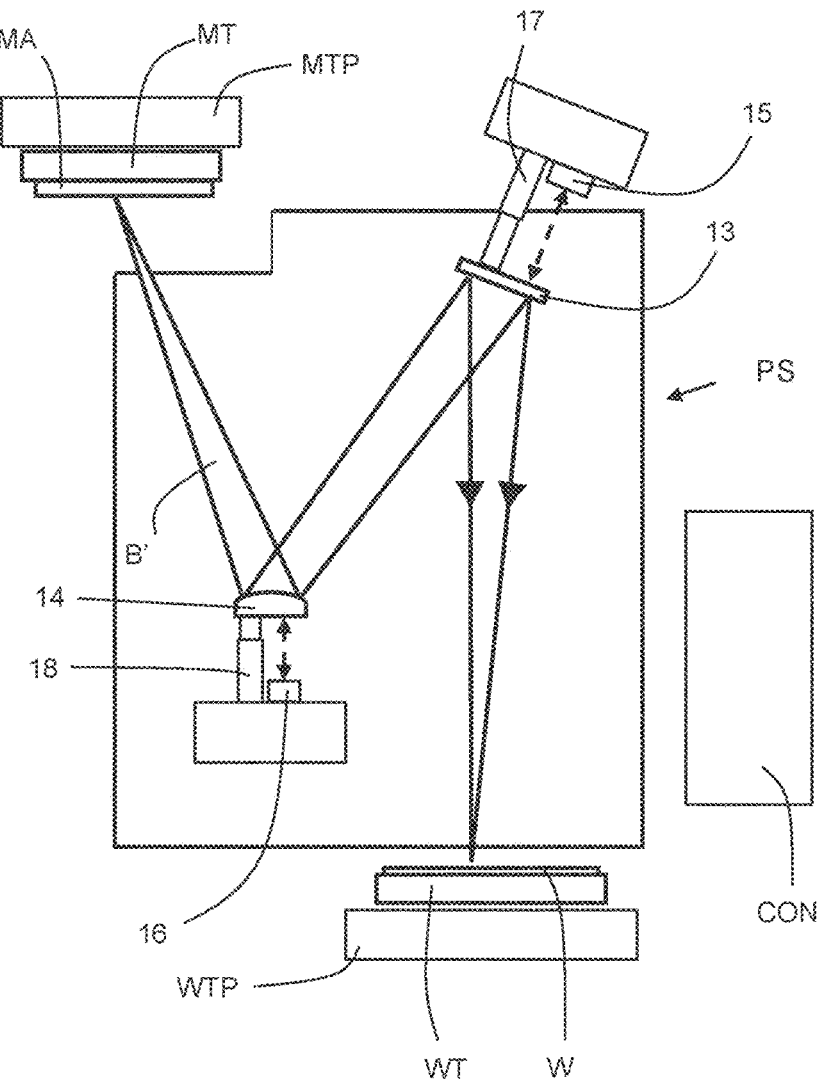
FIG. 2 depicts in more detail a part of the lithographic system of FIG. 1.

FIG. 2 shows in more detail the projection system PS of the lithographic apparatus of FIG. 1. The projection system comprises mirrors 13, 14, hereinafter referred to as first mirror 13 and second mirror 14. The first mirror 13 and the second mirror 14 are position controlled mirrors. This means that a position of the first mirror 13 is controlled in a first range of movement and a position of the second mirror 14 is controlled in a second range of movement.

A first position measurement system 15 is provided to measure an actual position of the first mirror 13. A second position measurement system 16 is provided to measure an actual position of the second mirror 14. A control unit CON is provided to control the position of the first and second mirrors 13, 14. The control unit CON comprises a first control loop to control the position of the first mirror 13 and a second control loop to control the position of the second mirror 14. On the basis of a first output signal of the control unit CON a first actuator 17 is actuated to position the first mirror 13 in the desired position. On the basis of a second output signal of the control unit CON a second actuator 18 is actuated to position the second mirror 14 in the desired position.

When more than two position controlled mirrors are provided in the projection system PS, a further position measurement may be provided for each further mirror to measure the position of this further mirror. The control unit CON may comprise for each further mirror a further control loop to control the position of the further mirror. The control unit CON may provide a further output signal of the control unit CON to an actuator to position the further mirror in the desired position.

The position of the first mirror 13, the second mirror 14 and of any further mirrors may be controlled in six degrees of freedom. The control unit CON is depicted as a single unit for controlling the position of the first mirror 13, the second mirror 14 and any further mirror. This control unit CON may for example be integrated in a central processing device of the lithographic apparatus LA or a separate control unit of the projection system PS. It is also possible that for each control loop a separate control processor is provided.

The first and second position measurement systems 15, 16 may be interferometer measurement systems. In the measurements of these position measurement systems 15, 16 there may be periodic deviations, so called cyclic errors. Since the cyclic errors have a negative effect on the accuracy of position measurement of the first and second mirrors 13, 14, it is desirable that these cyclic errors are compensated. To realize this compensation the cyclic errors may be calibrated and compensated in software. But this is only possible when these cyclic errors are stable over time. However, for example due to thermal drift, the cyclic errors may change over time, and as a result the calibration is not accurate and the measurement accuracy may substantially decrease due to drift effects.

Thus, in the projection system PS, the first position measurement system 15 may introduce a first cyclic error and the second position measurement 16 may introduce a second cyclic error, which first and second cyclic errors may only be partly reduced by calibration.

The projection system PS shown in FIG. 2 is configured to substantially reduce the effect of the first and second cyclic errors by using continuous movement of the first mirror 13 and the second mirror 14 at least during the projection phase, e.g. the exposure phase and/or the alignment phase of the lithographic process, when positioning of the substrate W is critical for the optical performance of the lithographic process. By this continuous movement of the first mirror 13 and the second mirror 14, the first and second cyclic errors will become high frequent disturbances. By selection of a suitable velocity of the continuous movement of the first mirror 13 and the second mirror 14, a first main frequency of the first cyclic error may be shifted above a first bandwidth of the first control loop and a second main frequency of the second cyclic error may be shifted above the second bandwidth of the second control loop. As a result, the first control loop will no longer be capable of following the first cyclic error and the second control loop will no longer be capable of following the second cyclic error. Thus, by continuous movement of the first mirror 13 and the second mirror 14, the negative effects of the first and second cyclic errors can be effectively reduced.

At the same time, random movements of the first mirror 13 and second mirror 14 will have a negative impact on the optical performance of the projection system PS. The projection system PS is therefore further configured to adapt the movements of the first mirror 13 and the second mirror 14 to each other to reduce an alignment error between the first mirror 13 and the second mirror 14 resulting from continuously moving the first mirror 13 and the second mirror 14.

The continuous movements of the first mirror 13 and the second mirror 14 during the projection phase may have a constant non-zero velocity and be in a constant direction.

Figure 3:
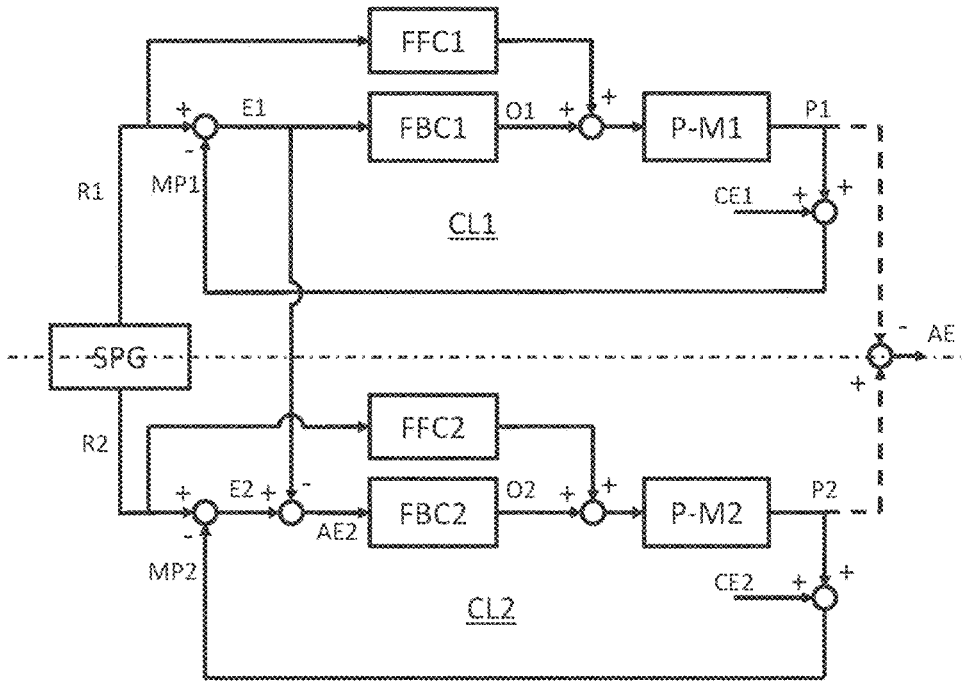
FIG. 3 depicts a control system of a projection system according to an embodiment of the invention.

In an embodiment, the continuous movements of the first mirror 13 and the continuous movements of the second mirror 14 are configured such that one of the first and second mirrors 13, 14 follows the other of the first and second mirrors 13, 14. In such embodiment there is one so called leading mirror and one or more following mirrors. In the embodiment of FIG. 2 heaviest mirror, first mirror 13, is selected as the leading mirror and the second mirror 14 is a following mirror. FIG. 3 depict schematically the first control loop CL-1 and the second control loop CL-2.

A set-point generator SPG is provided. The set-point generator SPG outputs a desired position R1 of the first mirror 13. This desired position R1 follows the desired movement profile of the first mirror 13 with a continuous movement with constant velocity during the projection phase of the lithographic process. A first measured position MP1 of the first mirror 13 is subtracted from the desired position R1 to determine a first position error E1 of the first mirror 13. The first measured position MP1 comprises the cyclic error CE1 introduced by the first position measurement system 15. The first position error E1 is fed into a first feedback controller FBC1. The first feedback controller FBC1 provides an output signal O1 that is provided as a first actuation signal fed to the first actuator 17 which is part of the block P-M1 in the first control loop. The first control loop CL-1 may comprise a first feedforward controller FFC1 that provides on the basis of the desired position R1 a feed forward output signal that is added to the output signal O1 of the first feedback controller FBC1.

Correspondingly, the set-point generator SPG outputs a desired position R2 of the second mirror 14. This desired position R2 follows a similar desired movement profile as the desired position R1 of the first mirror 13. A second measured position MP2 of the second mirror 14 is subtracted from the desired position R2 to determine a second position error E2 of the second mirror 14. The second measured position MP2 comprises the cyclic error CE2 introduced by the second position measurement system 16. Before the second position error E2 is fed into a second feedback controller FBC2, the first position error E1 of the first control loop CL-1 is subtracted from the second position error E2 to determine an adapted second position error AE2. The adapted second position error AE2 is fed into the second feedback controller FBC2 and the second feedback controller FBC2 provides an output signal O2 that is provided as a second actuation signal to the second actuator 18 which is part of the block P-M2 of the second control loop CL-2.

The second control loop CL-2 may comprise a second feedforward controller FFC2 that provides on the basis of the desired position R2 a feed forward output signal that is added to the output signal O2 of the second feedback controller FBC2.

By introducing the first position error E1, i.e. the position error of the first mirror 13, into the second control loop CL-2, the feedback controller FBC2 will try to correct for the first position error E1 of the first mirror 13. The first position error E1 has a low frequent content, i.e. within the first bandwidth, because the first control loop CL-1 cannot follow the trajectory with high accuracy and the high frequent error due to the cyclic error. The low frequent content, within the second bandwidth of the second feedback controller FBC2, will be followed by the second control loop CL-2 which means that the second mirror 14 stays well aligned with the first mirror 13. In other words, the first mirror 13 and the second mirror 14 make the same or a similar deviation from the desired trajectory. The similar deviation may occur when a coordinate transformation is applied between the movement of the first mirror 13 and the second mirror 14. The same coordinate transformation will then also be applied to the error E1 before it is introduced into the second control loop CL-2.

The adapted second position error AE2 of the second mirror 14 has three components:

a) A small positioning error as it has to correct for the first position error E1 of the first mirror 13. This is a relatively small error because this is a low frequent error;

b) A large contribution at high frequencies due to the first cyclic error CE1 of the first position measurement system 15 of the first mirror 13; and c) A similar high frequent contribution due to the second cyclic error CE2 of the second position measurement system 16 of the second mirror 14.

Only component a) will add up to the alignment error AE, schematically indicated in FIG. 3 as the difference between an actual position P1 of the first mirror 13 and an actual position P2 of the second mirror 14. Components b) and c) will not have a substantial effect on the alignment error AE because these errors are based on the first cyclic error CE1 and the second cyclic error CE2, which are measurement errors that cannot be followed by the second feedback controller FBC2.

It is noted that in the embodiment of FIG. 3, the first position error E1 is subtracted from the second position error E2 to obtain the adapted second position error AE2. In alternative embodiments, the first position error E1 may also be introduced into the second control loop CL-2 by adding the first position error E1 to the second measured position MP2. The adapted second position error AE2 will then be obtained by subtracting the combination of the second measured position MP2 and the first position error E1 from the second desired position R2. Also, it is possible to first subtract the first position error E1 from the second desired position R2 and then subtract the second measured position MP2 to obtain the adapted second position error AE2.

When more than two position controlled mirrors are provided in the projection system PS, each of the position controlled mirrors may be controlled as a following mirror, wherein the first position error of the leading mirror, in this embodiment first position error E1 of the first mirror 13, is fed into each further control loop to determine an adapted further position error on the basis of which the feedback controller of the further control loop may provide a further output signal to an actuator to position the further mirror in the desired position. By feeding this first position error of the leading mirror into the respective further control loop the further mirror will make a similar deviation from the desired trajectory as the first mirror 13.

In practice, it is advantageous that each mirror of the projection system PS is a position controlled mirror that is controlled as a following mirror following one leading mirror. The leading mirror may be any suitable mirror, for example the heaviest mirror and/or a mirror dominant for the optical performance of the projection system PS. Further, it may be advantageous to feed the first position error E1 of the first control loop CL1, i.e. the position error of the leading mirror, also in the control loops for positioning the patterning device support structure MT and/or the substrate table WT in order to improve alignment of the patterning device support structure MT and/or the substrate table WT with respect to the first mirror 13.

Figure 4:
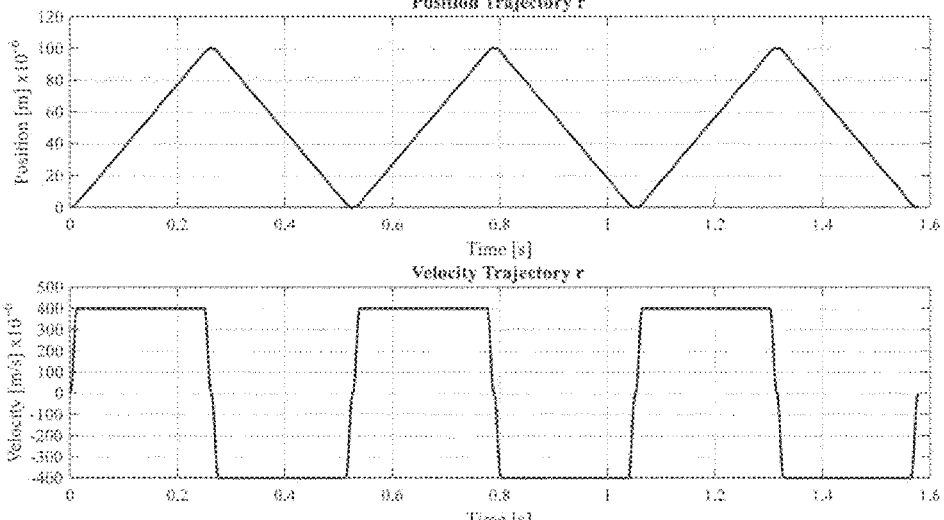
FIG. 4 shows an example of movements of the mirrors of the projection system in order to reduce cyclic error effects.

FIG. 4 shows, as an example, a movement profile of the desired position R1 of the first mirror 13. The upper graph shows the position in time and the lower graph shows the velocity over time. It can be seen that the first mirror is moved over a first range of movement of about 100 μm with a constant velocity of about 400 μm/s. This movement with constant velocity is carried out during projection phases of the lithographic process. During the idle phase between projection phases, the direction of movement may be changed by deceleration and acceleration of the first mirror 13 in the opposite direction.

The movement profile of the desired position R2 of the second mirror 14 may be the same as the desired position R1 of the first mirror 13. However, in practice, the movement profiles of the following mirrors, e.g. second mirror 14, may include a position transformation with respect to the movements of the leading mirror, e.g. first mirror 13.

The first cyclic error CE1 and second cyclic error CE2 may have a periodicity of for example 160 nm. When moving the first mirror 13 and the second mirror 14 with a constant velocity of about 400 μm/s, this will lead to a first main frequency of the first cyclic error in the first control loop CL-1 of about 2.5 kHz. This is well above the first bandwidth of the first control loop CL-1 and the second bandwidth of the second control loop CL-2. As a result, the first cyclic error CE1 cannot be followed by the first control loop CL-1 and the second cyclic error CE2 cannot be followed by the second control loop CL-2.

For the projection system PS of a lithographic apparatus it is important that the continuous movements of the mirrors 13, 14 have a relatively low negative effect on the optical performance of the projection system PS. It may therefore be advantageous that the movement profiles of the desired positions of the mirrors are not selected to make substantially the same movements or movement profiles, but that they are selected to have a low negative impact on the optical performance.

The optical sensitivity of the projection system PS for relative positions of mirrors of in a projection system may be described in an optical sensitivity matrix. When the movement profiles of the mirrors are selected to be in a nullspace of the optical sensitivity matrix, the movements may have relatively low impact on the optical performance of the projection system PS. Thus, the optical sensitivity matrix may be used to design the desired movement profiles of the leading mirrors and following mirrors. The inventors found that in a projection system PS with more than two position controlled mirrors it might be beneficial to keep at least one of the other mirrors standing still. Furthermore they found that it might be beneficial to limit the total amount of movement per position controlled mirror within a predetermined range.

Since the periodicity of the cyclic error of the first position measurement system 15 and the second position measurement system 16 can be accurately measured, and the velocity of the movements of the first mirror 13 and the second mirror 14 can be accurately controlled, the main frequencies of the first cyclic error and the second cyclic error can be accurately predicted. To further decrease the possible negative effects of the presence of the cyclic errors, the first control loop CL-1 may be provided with a first filter, for example a first notch filter having a first filter frequency corresponding to the first main frequency of the first cyclic error resulting from moving the first mirror 13. Correspondingly, the second control loop CL-2 may be provided with a second filter, for example a second notch filter having a second filter frequency corresponding to the second main frequency of the second cyclic error resulting from moving the second mirror 14.

Embodiments are provided according to following numbered clause:

1. A method of reducing cyclic error effects in a lithographic process having a projection phase and an idle phase, the method comprising:
    controlling in a first control loop a first position of a first module, the first module being a position-controlled mirror of a projection system, the first control loop having a first bandwidth and comprising a first position measurement system having a first cyclic error,
    wherein controlling the first position comprises continuously moving the first module at least during the projection phase, such that a first main frequency of the first cyclic error will be above the first bandwidth of the first control loop.

2. The method of clause 1, wherein the method comprises controlling in a second control loop a second position of a second module,
    wherein controlling the first position and the second position comprises adapting movements of the first module and movements of the second module to each other to reduce an alignment error between the first module and the second module resulting from continuously moving the first module.

3. The method of clause 2, wherein the second control loop has a second bandwidth and comprises a second position measurement system having a second cyclic error,
    wherein controlling the first position and the second position comprises:

continuously moving the second module at least during the projection phase, such that a second main frequency of the second cyclic error will be above the second bandwidth of the second control loop, and adapting movements of the first module and movements of the second module to each other to reduce an alignment error between the first module and the second module resulting from continuously moving the first module and the second module.

4. The method of clause 2 or 3, wherein adapting movements of the first module and movements of the second module to each other comprises adapting movements of the second module to movements of the first module such that the second module follows the first module.

5. The method of any of clauses 2-4, the method comprising:

feeding a first position error in the first control loop between a first actual position of the first module and a first reference position of the first module into the second control loop, determining an adapted second position error based on a second actual position of the second module, a second reference position of the second module and the first position error, and using the adapted second position error as input for a feedback controller of the second control loop.

6. The method of any of clauses 2-5, wherein the second module is a second position-controlled mirror, a patterning device support or a substrate support.

7. The method of any of clauses 2-6, wherein movements of the first module and movements of the second module are adapted to be in a null-space of an optical sensitivity matrix of the projection system.

8. The method of any of clauses 2-7, wherein the method comprises:

controlling in a further control loop a position of a further module, the further control loop having a bandwidth and a position measurement system having a cyclic error, wherein controlling the position of the further module comprises continuously moving the further module at least during the projection phase, such that a main frequency of the cyclic error will be above the bandwidth of the further control loop, and wherein movements of the further module are adapted to movements of the first module to reduce an alignment error between the first module and the further module resulting from continuously moving the first module.

9. The method of clause 8, wherein the further module is a position-controlled mirror, a patterning device support or a substrate support.

10. The method of any of clauses 1-9, wherein moving the first module at least during the projection phase comprises moving the first module with a constant non-zero velocity and in a constant direction.

11. The method of clause 10, wherein the idle phase is used to adapt a direction of movement and/or velocity of the first module.

12. The method of any preceding clause, wherein the first position measurement system and/or the second position measurement system are/is an interferometer.

13. The method of any preceding clause, wherein the first control loop comprises a first notch filter having a first filter frequency corresponding to the first main frequency of the first cyclic error resulting from moving the first module.

14. The method of any of clauses 3-13, wherein the second control loop comprises a second notch filter having a second filter frequency corresponding to the second main frequency of the second cyclic error resulting from moving the second module.

15. A projection system to project a beam, the projection system comprising:

a first module having a first movement range, the first module being a position-controlled mirror of the projection system arranged to reflect the beam, a first position measurement system to measure a first position of the first module, a control system comprising a first control loop to control the first position of the first module, the first control loop having a first bandwidth, wherein the control system is arranged to continuously move the first module at least during a projection phase of a lithographic process, such that a first main frequency of a first cyclic error of the first position measurement system will be above the first bandwidth of the first control loop.

16. The projection system of clause 15, wherein the projection system comprises:

a second module having a second movement range, and a second position measurement system to measure a second position of the second module, wherein the control system comprises a second control loop to control the second position of the second module, wherein the control system is arranged to adapt movements of the first module and movements of the second module to each other to reduce an alignment error between the first module and the second module resulting from continuously moving the first module.

17. The projection system of clause 16, wherein the second control loop has a second bandwidth, wherein the control system is arranged to continuously move the second module at least during a projection phase of the projection system, such that a second main frequency of a second cyclic error of the second position measurement system will be above the second bandwidth of the second control loop, and wherein the control system is arranged to adapt movements of the first module and movements of the second module to each other to reduce an alignment error between the first module and the second module resulting from continuously moving the first module and the second module.

18. The projection system of clause 16 or clause 17, wherein the control system is arranged to adapt movements of the second module to movements of the first module such that the second module follows the first module.

19. The projection system of any of clauses 16-18, wherein the control system is arranged to:

feed a first position error in the first control loop between a first actual position of the first module and a first reference position of the first module into the second control loop, determine an adapted second position error based on a second actual position of the second module, a second reference position of the second module and the first position error, and

use the adapted second position error as input for a feedback controller of the second control loop.

20. The projection system of any of clauses 16-19, wherein the second module is a second position-controlled mirror, a patterning device support or a substrate support.

21. The projection system of any of clauses 16-20, wherein movements of the first module and movements of the second module are adapted to be in a null-space of an optical sensitivity matrix of the projection system.

22. The projection system of any of clauses 16-21, wherein the projection system comprises:

a further module having a movement range;

a further position measurement system to measure a position of the further module, the control system comprising a further control loop to control the position of the further module, the further control loop having a bandwidth, wherein the control system is further arranged to continuously move the further module at least during the projection phase of the projection system, such that a main frequency of a cyclic error of the further position measurement system will be above the bandwidth of the further control loop and to adapt movements of the further module to movements of the first module to reduce an alignment error between the first module and the further module resulting from continuously moving the first module and the further module.

23. The projection system of clause 22, wherein the further module is a position-controlled mirror, a patterning device support or a substrate support.

24. The projection system of any of clauses 15-23, wherein the control system is arranged to move the first module at least during the projection phase with a constant non-zero velocity and in a constant direction.

25. The projection system of clause 24, wherein the control system is arranged to adapt a direction of movement and/or velocity of the first module during the idle phase.

26. The projection system of any of clauses 15-25, wherein the first position measurement system and/or the second position measurement system are/is an interferometer.

27. The projection system of any of clauses 15-26, wherein the first control loop comprises a first notch filter having a first filter frequency corresponding to the first main frequency of the first cyclic error resulting from moving the first module.

28. The projection system of any of clauses 17-27, wherein the second control loop comprises a second notch filter having a second filter frequency corresponding to the second main frequency of the second cyclic error resulting from moving the second module.

29. A lithographic apparatus comprising the projection system of any of clauses 15-28.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A method of reducing cyclic error effects in a lithographic process having a projection phase and an idle phase, the method comprising controlling in a first control loop a first position of a first module, the first module being a position controlled mirror of a projection system, the first control loop having a first bandwidth and comprising a first position measurement system having a first cyclic error, wherein controlling the first position comprises continuously moving the first module at least during the projection phase, such that a first main frequency of the first cyclic error will be above the first bandwidth of the first control loop.

2. The method of claim 1, further comprising controlling in a second control loop a second position of a second module, wherein controlling the first position and the second position comprises adapting movements of the first module and movements of the second module to each other to reduce an alignment error between the first module and the second module resulting from continuously moving the first module.

3. The method of claim 2, wherein adapting movements of the first module and movements of the second module to each other comprises adapting movements of the second module to movements of the first module such that the second module follows the first module.

4. The method of claim 2, further comprising:

feeding a first position error in the first control loop between a first actual position of the first module and a first reference position of the first module into the second control loop, determining an adapted second position error based on a second actual position of the second module, a second reference position of the second module and the first position error, and using the adapted second position error as input for a feedback controller of the second control loop.

5. The method of claim 2, wherein movements of the first module and movements of the second module are adapted to be in a null-space of an optical sensitivity matrix of the projection system.

6. The method of claim 1, wherein moving the first module at least during the projection phase comprises moving the first module with a constant non-zero velocity and in a constant direction.

7. The method of claim 1, wherein the first position measurement system is an interferometer.

8. A projection system to project a beam, the projection system comprising:

a first module having a first movement range, the first module being a position controlled mirror of the projection system arranged to reflect the beam, a first position measurement system to measure a first position of the first module, and a control system comprising a first control loop to control the first position of the first module, the first control loop having a first bandwidth, wherein the control system is arranged to continuously move the first module at least during a projection phase of a lithographic process, such that a first main frequency of a first cyclic error of the first position measurement system will be above the first bandwidth of the first control loop.

9. The projection system of claim 8, wherein the projection system comprises:

a second module having a second movement range, and a second position measurement system to measure a second position of the second module, wherein the control system comprises a second control loop to control the second position of the second module, and wherein the control system is arranged to adapt movements of the first module and movements of the second module to each other to reduce an alignment error between the first module and the second module resulting from continuously moving the first module.

10. The projection system of claim 9, wherein the second control loop has a second bandwidth, wherein the control system is arranged to continuously move the second module at least during a projection phase of the projection system, such that a second main frequency of a second cyclic error of the second position measurement system will be above the second bandwidth of the second control loop, and wherein the control system is arranged to adapt movements of the first module and movements of the second module to each other to reduce an alignment error between the first module and the second module resulting from continuously moving the first module and the second module.

11. The projection system of claim 9, wherein the control system is arranged to adapt movements of the second module to movements of the first module such that the second module follows the first module.

12. The projection system of claim 9, wherein the control system is arranged to:

feed a first position error in the first control loop between a first actual position of the first module and a first reference position of the first module into the second control loop, determine an adapted second position error based on a second actual position of the second module, a second reference position of the second module and the first position error, and use the adapted second position error as input for a feedback controller of the second control loop.

13. The projection system of claim 9, wherein the second module is a second position controlled mirror, a patterning device support or a substrate support.

14. The projection system of claim 9, wherein movements of the first module and movements of the second module are adapted to be in a null-space of an optical sensitivity matrix of the projection system.

15. The projection system of claim 9, wherein the projection system comprises:

a further module having a movement range, and a further position measurement system to measure a position of the further module, wherein the control system comprises a further control loop to control the position of the further module, the further control loop having a bandwidth, wherein the control system is further arranged to continuously move the further module at least during the projection phase of the projection system, such that a main frequency of a cyclic error of the further position measurement system will be above the bandwidth of the further control loop and to adapt movements of the further module to movements of the first module to reduce an alignment error between the first module and the further module resulting from continuously moving the first module and the further module.

16. The projection system of claim 8, wherein the control system is arranged to move the first module at least during the projection phase with a constant non-zero velocity and in a constant direction.

17. The projection system of claim 16, wherein the control system is arranged to adapt a direction of movement and/or velocity of the first module during an idle phase.

18. The projection system of claim 8, wherein the first position measurement system is an interferometer.

19. The projection system of claim 8, wherein the first control loop comprises a first notch filter having a first filter frequency corresponding to a first main frequency of the first cyclic error resulting from moving the first module.

20. A lithographic apparatus comprising the projection system of claim 8.

* * * * *